United States Patent
Lee et al.

(10) Patent No.: US 12,183,653 B2
(45) Date of Patent: *Dec. 31, 2024

(54) THERMAL CONDUCTIVE FILM

(71) Applicant: SAMSUNG ELECTRONICS CO., LTD., Suwon-si (KR)

(72) Inventors: Joungphil Lee, Suwon-si (KR); Myung-Sung Kang, Yongin-si (KR); Yeongseok Kim, Hwaseong-si (KR); Gwangsun Seo, Jeonju-si (KR); Hyein Yoo, Suwon-si (KR); Yongwon Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 340 days.

This patent is subject to a terminal disclaimer.

(21) Appl. No.: 17/726,916

(22) Filed: Apr. 22, 2022

(65) Prior Publication Data

US 2022/0246491 A1 Aug. 4, 2022

Related U.S. Application Data

(63) Continuation of application No. 16/540,495, filed on Aug. 14, 2019, now Pat. No. 11,355,413.

(30) Foreign Application Priority Data

Dec. 28, 2018 (KR) .......................... 10-2018-0171499

(51) Int. Cl.
*H01L 23/373* (2006.01)
*C09J 7/28* (2018.01)
(Continued)

(52) U.S. Cl.
CPC ............ *H01L 23/3735* (2013.01); *C09J 7/28* (2018.01); *C09J 11/04* (2013.01); *H01L 23/295* (2013.01);
(Continued)

(58) Field of Classification Search
CPC ............... H01L 23/3735; H01L 23/295; H01L 23/3135; H01L 23/5385; H01L 24/29;
(Continued)

(56) References Cited

U.S. PATENT DOCUMENTS 5,531,955 A 7/1996 Sugikawa
5,604,026 A 2/1997 King
(Continued)

FOREIGN PATENT DOCUMENTS

JP H09-162336 A 6/1997
JP 2008-159990 A 7/2008
(Continued)

OTHER PUBLICATIONS

Machine Translation of JP 2017-107731A (Year: 2021).*
(Continued)

*Primary Examiner* — Scott R. Walshon
(74) *Attorney, Agent, or Firm* — Muir Patent Law, PLLC

(57) ABSTRACT

An adhesive film includes a porous metal layer having a plurality of pores therein, a first adhesive layer on one side of the porous metal layer, an adhesive substance at least partially filling the pores of the porous metal layer, and a plurality of first thermal conductive members distributed in the first adhesive layer.

20 Claims, 8 Drawing Sheets

(51) Int. Cl.
*C09J 11/04* (2006.01)
*H01L 23/00* (2006.01)
*H01L 23/29* (2006.01)
*H01L 23/31* (2006.01)
*H01L 23/367* (2006.01)
*H01L 23/538* (2006.01)

(52) U.S. Cl.
CPC ...... *H01L 23/3135* (2013.01); *H01L 23/5385* (2013.01); *H01L 24/29* (2013.01); *H01L 24/30* (2013.01); *H01L 24/32* (2013.01); *H01L 24/73* (2013.01); *H01L 23/367* (2013.01); *H01L 2224/29011* (2013.01); *H01L 2224/29082* (2013.01); *H01L 2224/29139* (2013.01); *H01L 2224/29147* (2013.01); *H01L 2224/29155* (2013.01); *H01L 2224/2916* (2013.01); *H01L 2224/2929* (2013.01); *H01L 2224/29387* (2013.01); *H01L 2224/29388* (2013.01); *H01L 2224/29499* (2013.01); *H01L 2224/30505* (2013.01); *H01L 2224/32145* (2013.01); *H01L 2224/32245* (2013.01); *H01L 2224/73253* (2013.01); *H01L 2224/73265* (2013.01)

(58) Field of Classification Search
CPC ......... H01L 24/30; H01L 24/32; H01L 24/73; H01L 23/367; H01L 2224/29011; H01L 2224/29082; H01L 2224/29139; H01L 2224/291; H01L 2224/29155; H01L 2224/2916; H01L 2224/2929; H01L 2224/29387; H01L 2224/29388; H01L 2224/29499; H01L 2224/30505; H01L 2224/32145; H01L 2224/32245; H01L 2224/73253; H01L 2224/73265; H01L 23/3731; H01L 25/0652; H01L 2224/131; H01L 2224/16227; H01L 2224/2711; H01L 2224/29083; H01L 2224/29218; H01L 2224/2924; H01L 2224/29239; H01L 2224/29255; H01L 2224/2926; H01L 2224/29386; H01L 2224/29393; H01L 2224/321; H01L 2224/32225; H01L 2224/45099; H01L 2224/48227; H01L 2225/06589; H01L 23/42; H01L 23/3672; H01L 23/3733; H01L 23/3736; C09J 7/28; C09J 11/04; C09J 2301/124; C09J 2203/326

See application file for complete search history.

(56) References Cited

U.S. PATENT DOCUMENTS

| | | |
|---|---|---|
| 10,046,418 B2 | 8/2018 | Masumori et al. |
| 10,091,917 B2 | 10/2018 | Kim et al. |
| 10,595,413 B2 | 3/2020 | Kim et al. |
| 2006/0257624 A1 | 11/2006 | Naritomi et al. |
| 2013/0256894 A1 | 10/2013 | Adema |
| 2014/0242374 A1 | 8/2014 | Strasser et al. |
| 2016/0312074 A1 | 10/2016 | Choi et al. |
| 2017/0094824 A1 | 3/2017 | Krogdahl et al. |
| 2018/0174943 A1 | 6/2018 | Kinsley |
| 2018/0218962 A1 | 8/2018 | Geissler et al. |
| 2018/0226515 A1 | 8/2018 | Skeete |

FOREIGN PATENT DOCUMENTS

| | | |
|---|---|---|
| JP | 2009-010296 A | 1/2009 |
| JP | 2017-071826 A | 4/2017 |
| JP | 2017-107731 A | 6/2017 |
| KR | 10-0749565 B1 | 8/2007 |
| KR | 10-2008-0111944 A | 12/2008 |
| KR | 10-1289768 B1 | 7/2013 |
| KR | 10-2016-0099594 A | 8/2016 |
| KR | 10-1678257 B1 | 11/2016 |
| KR | 10-2017-0106071 A | 9/2017 |
| KR | 10-2018-0023384 A | 3/2018 |

OTHER PUBLICATIONS

Xiao, Zhu, "Heat Transfer, Fluid Transport and Mechanical Properties of Porous Copper Manufactured by Lost Carbonate Sintering," University of Liverpool, Nov. 2013.

\* cited by examiner

THERMAL CONDUCTIVE FILM

CROSS-REFERENCE TO RELATED APPLICATIONS

This is a continuation application based on pending U.S. application Ser. No. 16/540,495, filed on Aug. 14, 2019, the entire contents of which is hereby incorporated by reference.

Korean Patent Application No. 10-2018-0171499, filed on Dec. 28, 2018, in the Korean Intellectual Property Office, and entitled: "Adhesive Film, Semiconductor Apparatus Using the Same, and Semiconductor Package Including the Same," is incorporated by reference herein in its entirety.

BACKGROUND

1. Field

Embodiments relate to an adhesive film, a semiconductor apparatus using the same, and a semiconductor package including the same.

2. Description of the Related Art

Adhesives are used in a wide variety of applications, such as sheets, films, labels, and tapes, due to their easy usability, and materials to which adhesives are attached also include a wide variety of materials, such as organic materials, metallic materials, and inorganic materials. Applications of adhesives have recently been increasingly expanding over displays, touch screens, touch panels, touch lenses, electronic devices, electric electrodes, LED illuminations, and so on, which require high functionality in various properties and high durability and reliability against moisture, corrosion, and temperature.

SUMMARY

Embodiments are directed to an adhesive film, including a porous metal layer having a plurality of pores therein, a first adhesive layer on one side of the porous metal layer, an adhesive substance at least partially filling the pores of the porous metal layer, and a plurality of first thermal conductive members distributed in the first adhesive layer.

Example embodiments are also directed to a semiconductor apparatus, including a substrate, an exothermic device on the substrate, and an adhesive film between the substrate and the exothermic device. The adhesive film may include a porous metal layer having a plurality of pores therein, a first adhesive layer on one side of the porous metal layer, and an adhesive substance at least partially filling the pores of the porous metal layer.

Example embodiments are also directed to a semiconductor package, including a package substrate, a semiconductor chip on the package substrate, a heat radiator covering the semiconductor chip, and an adhesive film between the semiconductor chip and the heat radiator. The adhesive film may include a first adhesive layer on a top surface of the semiconductor chip, a porous metal layer on a top surface of the first adhesive layer, and an adhesive substance at least partially filling an inside of the porous metal layer.

BRIEF DESCRIPTION OF THE DRAWINGS

Features will become apparent to those of skill in the art by describing in detail example embodiments with reference to the attached drawings in which.

DETAILED DESCRIPTION

The following will now describe an adhesive film according to the present example embodiment with reference to the accompanying drawings.

Figure 1:
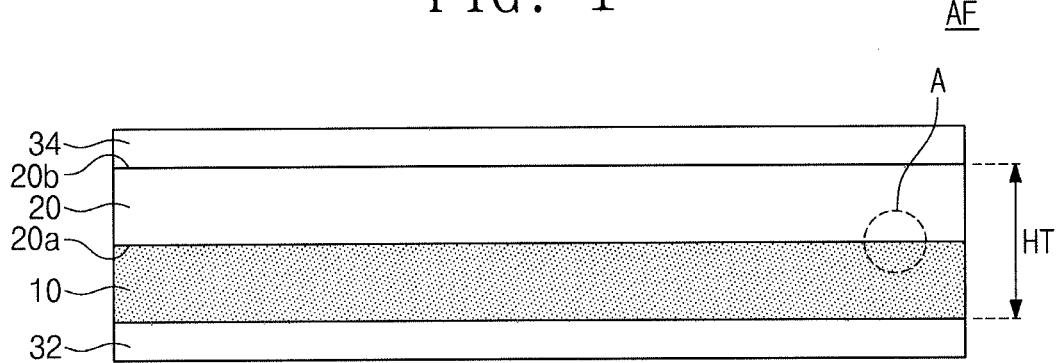
FIG. 1 illustrates a cross-sectional view showing an adhesive film according to an example embodiment.
Figure 2:
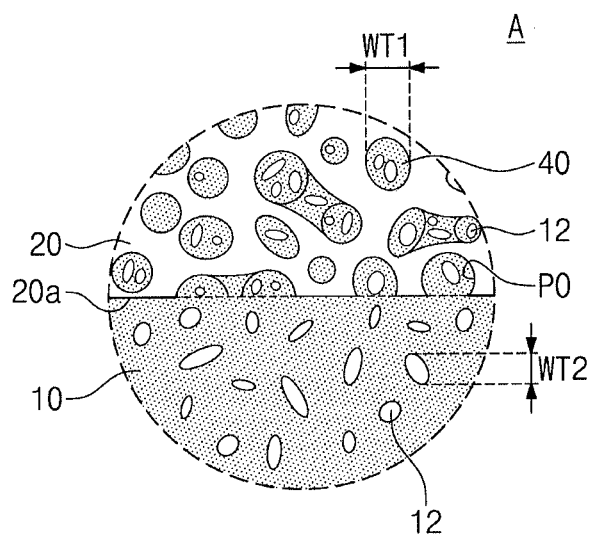
FIGS. 2 and 3 illustrate enlarged views showing section A of FIG. 1.
Figure 3:
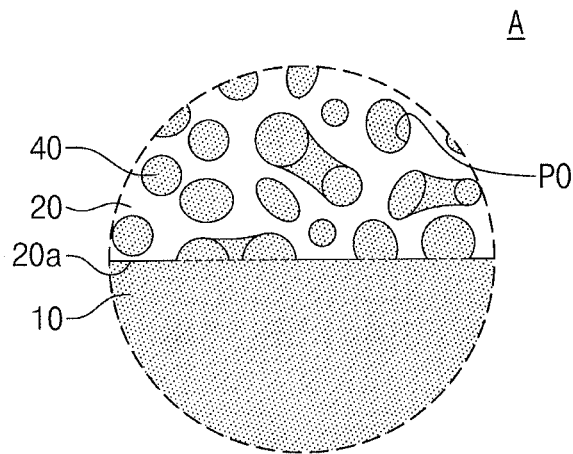

FIG. 1 illustrates a cross-sectional view showing an adhesive film according to an example embodiment. FIGS. 2 and 3 illustrate enlarged views showing section A of FIG. 1.

Referring to FIGS. 1 and 2, an adhesive film AF may be a thermally conductive adhesive film and may include a first adhesive layer 10, a metal layer 20, an adhesive substance 40, and first thermal conductive members 12.

The first adhesive layer 10 may be provided to have a film shape. The first adhesive layer 10 may include a non-conductive, e.g., electrically non-conductive, material. The first adhesive layer 10 may include an adhesive polymer. For example, the first adhesive layer 10 may include one or more of an acrylic polymer, an epoxy-based polymer, or a urethane-based polymer. The material of the first adhesive layer 10 may include another suitable adhesive polymer.

The metal layer 20 may be provided at a side of the first adhesive layer 10. The metal layer 20 may have a film shape. The metal layer 20 may include a material whose thermal conductivity is high. The metal layer 20 may include metal. For example, the metal layer 20 may include one or more of copper (Cu), nickel (Ni), iron (Fe), silver (Ag), zinc (Zn), aluminum (Al), or magnesium (Mg), or an alloy thereof. The alloy may include, e.g., aluminum-magnesium-copper alloy (for example, $AlMg_{15}Cu_{10}$) or zinc-aluminum-magnesium alloy (for example, $ZnAl_{3.3}Mg_{3.3}$). The material of the metal layer 20 may include another suitable metal or alloy having a high thermal conductivity.

The metal layer 20 may have a porous shape. For example, the metal layer 20 may have a plurality of pores PO therein. The pores PO may be formed within the metal layer 20, and one or more of the pores PO may be formed in contact with a surface, or at a surface of, the metal layer 20, e.g., at an interface between the first adhesive layer 10 and the metal layer 20. For example, one or more of the pores PO may be exposed at the surface of the metal layer 20. The metal layer 20 may have a porosity of about 30% to about 100%. In this description, the term "porosity" means a fraction of the volume of the pores over the total volume of the metal layer 20. The pores PO may have spherical, oval, or tunnel shapes. Each of the pores PO may have a major axis WT1 with a length of about 5 μm to about 3000 μm. The pores PO may be spatially connected to neighboring other pores PO. The metal layer 20 may be provided in the form of a porous shape or a metal sponge. Thus, the adhesive film AF may increase in workability (for example, machinability). For example, the metal layer 20 may improve in bending characteristics, ductile characteristics, or cut surface characteristics (the cut surface characteristics of the metal layer 20 will be further discussed below with reference to FIGS. 6 and 7).

The adhesive substance 40 may be impregnated into the metal layer 20. For example, the adhesive substance 40 may, e.g., at least partially, fill the pores PO of the metal layer 20. The metal layer 20 may be supported by the adhesive substance 40 disposed in the metal layer 20 (or in the pores PO), and accordingly the shape of the metal layer 20 may be prevented from being excessively deformed. For example, the adhesive substance 40 may prevent the metal layer 20 from being modified (by external force).

Because one or more of the pores PO are formed in contact with the surface of the metal layer 20, the adhesive substance 40 may be exposed at the surface of the metal layer 20. For example, the metal layer 20 may have a first surface 20a with which the first adhesive layer 10 is in contact, and on which the adhesive substance 40 is exposed, which may cause the adhesive substance 40 to contact the first adhesive layer 10. The metal layer 20 may have adhesiveness on the first surface 20a on which the adhesive substance 40 is exposed. The adhesive substance 40 may rigidly attach the metal layer 20 to the first adhesive layer 10. Therefore, the metal layer 20 may not be delaminated (or, dislodged) from the first adhesive layer 10, and the adhesive film AF may increase in structural stability.

The adhesive substance 40 may be exposed on a second surface 20b of the metal layer 20, which second surface 20b faces the first surface 20a. The metal layer 20 may have adhesiveness on the second surface 20b on which the adhesive substance 40 is exposed. Thus, the adhesive film AF may have adhesiveness both (a) on one side of the first adhesive layer 10 and (b) on an opposite side of the metal layer 20, and accordingly may be used as a double-sided adhesive film.

The adhesive substance 40 may include an adhesive polymer. The adhesive substance 40 may include the same material as that of the first adhesive layer 10. For example, the adhesive substance 40 may include one or more of an acrylic polymer, an epoxy-based polymer, or a urethane-based polymer. When the adhesive substance 40 includes the same material as that of the first adhesive layer 10, the adhesive substance 40 may have a continuous configuration with the first adhesive layer 10, and an invisible or imperceptible interface may be provided between the adhesive substance 40 and the first adhesive layer 10. For example, the adhesive substance 40 and the first adhesive layer 10 may be provided in the form of a single body. The adhesive substance 40 may be a portion of the first adhesive layer 10 impregnated into the pores PO of the metal layer 20. In another implementation, when the adhesive substance 40 includes a different material from that of the first adhesive layer 10, a visible or perceptible interface may be provided between the adhesive substance 40 and the first adhesive layer 10.

The first thermal conductive members 12 may be provided in the first adhesive layer 10. The first thermal conductive members 12 may have, e.g., bead, wire, or rod shapes. Each of the first thermal conductive members 12 may have a size less than that of the pore PO of the metal layer 20. Each of the first thermal conductive members 12 may have a major axis WT2 with a length of about 1 μm to about 1500 μm. In another implementation, the, e.g., average, size of the first thermal conductive members 12 may be greater than the, e.g., average, size of the pore PO. The first thermal conductive members 12 may be distributed in the first adhesive layer 10. The first thermal conductive members 12 may have or occupy a volume fraction of about 1% to about 15% over the volume of the first adhesive layer 10. For example, about 1% to about 15% of the volume of the first adhesive layer 10 may be occupied by the first thermal conductive members 12. The first thermal conductive members 12 may increase thermal conductivity of the first adhesive layer 10. As a result, the adhesive film AF may increase in thermal conductivity. In addition, when the size of the first thermal conductive members 12 is less than that of the pore PO, the first thermal conductive members 12 may be distributed in the adhesive substance 40 filling the pores PO. The first thermal conductive members 12 may thus increase thermal conductivity of the metal layer 20. In another implementation, as shown in FIG. 3, the first thermal conductive members 12 may not be provided either in the adhesive substance 40 or in the adhesive film AF.

The following will discuss the embodiment shown in FIG. 2. The first thermal conductive members 12 may include a dielectric material. The first thermal conductive members 12 may include a material whose thermal conductivity is high. For example, the first thermal conductive members 12 may include one or more of amorphous silicon oxide ($SiO_2$), crystalline silicon oxide, aluminum oxide ($Al_2O_3$), magnesium oxide (MgO), zinc oxide (ZnO), silicon carbide (SiC), aluminum nitride (AlN), beryllium oxide (BeO), boron nitride (BN), or diamond. Additionally or alternatively, the first thermal conductive members 12 may include a dielectric material whose thermal conductivity is high.

The adhesive film AF including the metal layer 20 and the first adhesive layer 10 may have a combined thickness HT of about 10 μm to about 10000 μm.

The adhesive film AF may further include passivation layers 32 and 34. For example, a first passivation layer 32 may be provided on a bottom surface, e.g., a surface opposite the metal layer 20, of the first adhesive layer 10, and a second passivation layer 34 may be provided on the second surface 20b of the metal layer 20. The first passivation layer 32 may cover the bottom surface of the first adhesive layer 10 and may prevent the first adhesive layer 10 from being contaminated with foreign impurities. The second passivation layer 34 may cover the second surface 20b of the metal layer 20 and may prevent the metal layer 20 from being contaminated with foreign impurities. The first passivation layer 32 and the second passivation layer 34 may be disposed along surfaces of the first adhesive layer 10 and the metal layer 20, respectively, and may protect the adhesive film AF against foreign impurities until the adhesive film AF is ready to be used. The first and second passivation layers 32 and 34 may protect the adhesive film AF against foreign impurities, and may be removed when the adhesive film AF is used. The first and second passivation layers 32 and 34 may include, e.g., polyethylene terephthalate (PET) or paper. In other implementations, one or none of the first and second passivation layers 32 and 34 may be provided.

Figure 4:
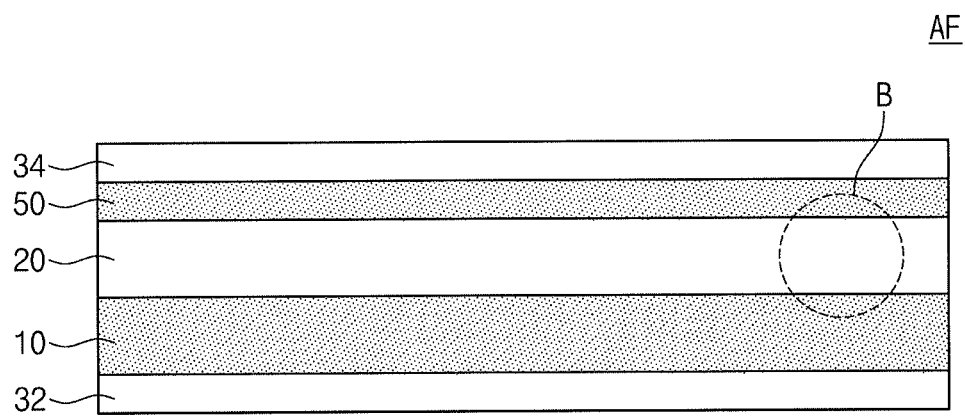
FIG. 4 illustrates a cross-sectional view showing an adhesive film according to an example embodiment.
Figure 5:
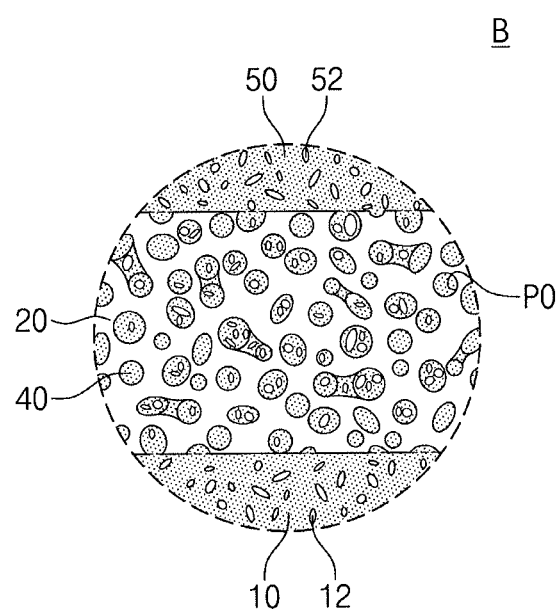
FIG. 5 illustrates an enlarged view showing section B of FIG. 4.

FIG. 4 illustrates a cross-sectional view showing an adhesive film according to an example embodiment. FIG. 5 illustrates an enlarged view showing section B of FIG. 4. For convenience of description, the following will mainly explain differences from those discussed with reference to FIGS. 1 and 2.

Referring to FIGS. 4 and 5, a second adhesive layer 50 may be provided on the metal layer 20. The second adhesive layer 50 may be disposed on one side of the metal layer 20, which one side stands opposite the first adhesive layer 10. For example, the metal layer 20 may be provided between the first adhesive layer 10 and the second adhesive layer 50. Because the first and second adhesive layers 10 and 50 are provided on opposite sides of the metal layer 20, the adhesive film AF may be used as a double-sided adhesive film and may increase in adhesiveness. The second adhesive layer 50 may have a film shape. The second adhesive layer 50 may include an, e.g., electrically, non-conductive material. The second adhesive layer 50 may include an adhesive polymer. The second adhesive layer 50 may include the same material as that of the first adhesive layer 10. For example, the second adhesive layer 50 may include one or more of an acrylic polymer, an epoxy-based polymer, or a urethane-based polymer. When the second adhesive layer 50 includes the same material as that of the adhesive substance 40, the second adhesive layer 50 may have a continuous configuration with the adhesive substance 40, and an invisible or imperceptible interface may be provided between the adhesive substance 40 and the second adhesive layer 50. For example, the adhesive substance 40 and the second adhesive layer 50 may be provided in the form of a single body. The adhesive substance 40 may be a portion of the second adhesive layer 50 impregnated into the pores PO of the metal layer 20. When the first adhesive layer 10, the adhesive substance 40, and the second adhesive layer 50 include the same material, the first adhesive layer 10, the adhesive substance 40, and the second adhesive layer 50 may be provided in the form of a single body. In another implementation, when the second adhesive layer 50 includes a different material from that of the adhesive substance 40, a visible or perceptible interface may be provided between the adhesive substance 40 and the second adhesive layer 50.

Second thermal conductive members 52 may be provided in the second adhesive layer 50. The second thermal conductive members 52 may have bead, wire, or rod shapes. Each of the second thermal conductive members 52 may have an, e.g., average, size less than an, e.g., average, size of the pore PO of the metal layer 20. Each of the second thermal conductive members 52 may have a major axis with a length of about 1 μm to about 1500 μm. In another implementation, the, e.g., average, size of the second thermal conductive members 52 may be greater than the, e.g., average, size of the pore PO. The second thermal conductive members 52 may be distributed in the second adhesive layer 50. The second thermal conductive members 52 may have a volume fraction of about 1% to about 50% over the volume of the second adhesive layer 50. For example, about 1% to about 50% of the volume fraction of the second adhesive layer 50 may be occupied by the second thermal conductive members 52. The second thermal conductive members 52 may increase thermal conductivity of the second adhesive layer 50. As a result, the adhesive film AF may increase in thermal conductivity. In another implementation, the second thermal conductive members 52 may not be provided in the second adhesive layer 50. The second thermal conductive members 52 may include a dielectric material. The second thermal conductive members 52 may include a material whose thermal conductivity is high. The second thermal conductive members 52 may include the same material as that of the first thermal conductive members 12. For example, the second thermal conductive members 52 may include one or more of amorphous silicon oxide ($SiO_2$), crystalline silicon oxide, aluminum oxide ($Al_2O_3$), magnesium oxide (MgO), zinc oxide (ZnO), silicon carbide (SiC), aluminum nitride (AlN), beryllium oxide (BeO), boron nitride (BN), or diamond.

Figure 6:
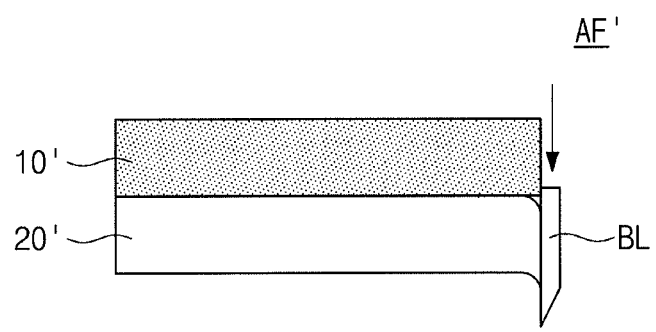
FIG. 6 illustrates a cross-sectional view showing processing of an adhesive film according to a comparative example.

FIG. 6 illustrates a cross-sectional view showing processing of an adhesive film according to a comparative example.

In the comparative example illustrated in FIG. 6, an adhesive film AF' includes a metal layer 20' provided on an adhesive layer 10'. The adhesive film AF' may be cut by a blade BL or a sawing process and then attached to a target object, or attached to a target object and then cut together with the target object. When the adhesive film AF' is so processed, the metal layer 20' may be deformed. For example, as shown in FIG. 6, the blade BL may cut the adhesive film AF' in such a way that a boundary between the metal layer 20' and the blade BL is deformed by shear stress caused by friction between the metal layer 20' and the blade BL. The shear stress may cause slip of crystals of the metal layer 20' made of only metal, which may result in a burr or pick-up phenomenon in which the blade BL drags a cutting portion of the metal layer 20'.

Figure 7:
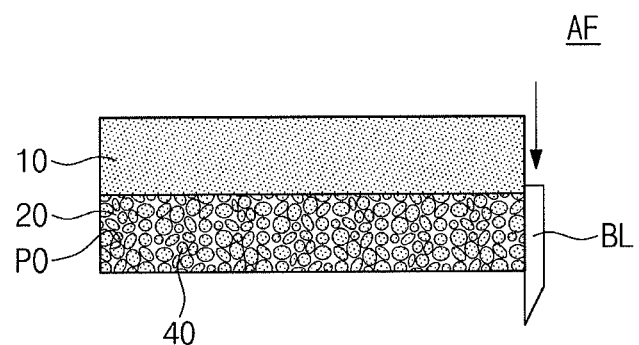
FIG. 7 illustrates a cross-sectional view showing processing of an adhesive film according to an example embodiment.

FIG. 7 illustrates a cross-sectional view showing processing of an adhesive film according to an example embodiment.

Referring to FIG. 7, the adhesive film AF may be cut and then attached to a target object, or attached to a target object and then cut together with the target object. When the adhesive film AF is processed, the metal layer 20 may be free of deformation. For example, as shown in FIG. 7, the blade BL may cut the adhesive film AF. In this case, the blade BL may alternately meet the metal layer 20 and the pores PO along a movement path of the blade BL. It may thus be possible to minimize or reduce a burr or pick-up phenomenon of the metal layer 20 during the cut process. In addition, the metal layer 20 may be supported by the adhesive substance 40 in the pores PO, and thus prevented from deformation. As a result, according to the present example embodiment, the adhesive film AF may improve in surface characteristics during work processes and increase in structural stability.

Figure 8:
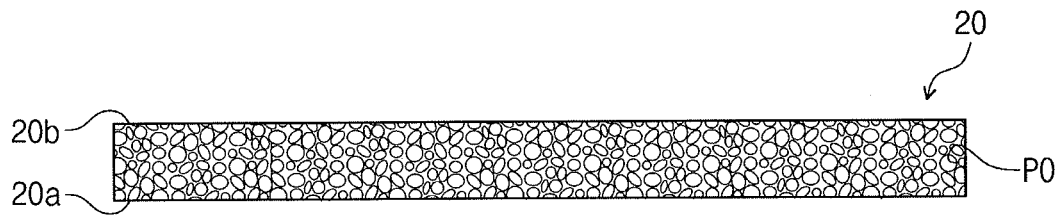
FIGS. 8 to 10 illustrate cross-sectional views showing stages in a method of manufacturing an adhesive film according to an example embodiment.
Figure 9:
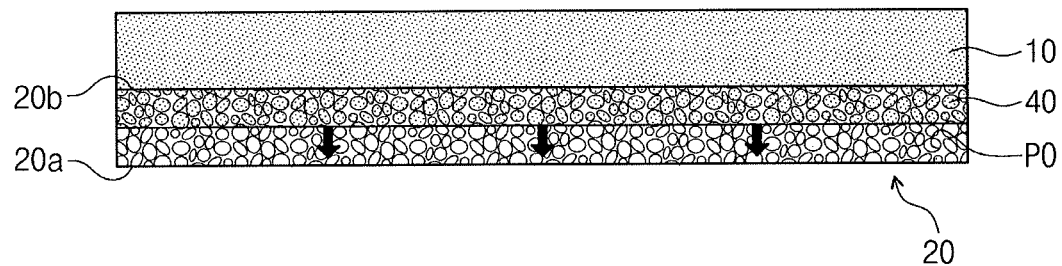
Figure 10:
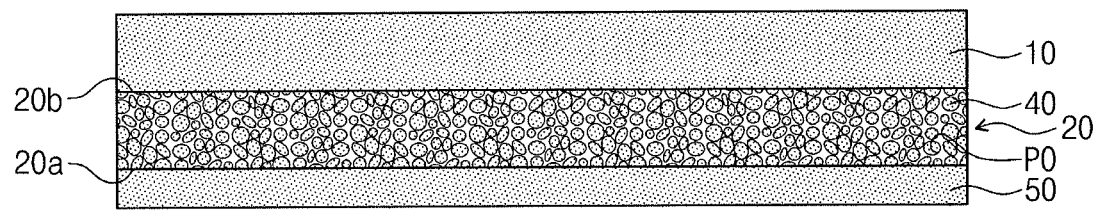

FIGS. 8 to 10 illustrate cross-sectional views showing stages in a method of manufacturing an adhesive film according to an example embodiment.

Referring to FIG. 8, a metal layer 20 may be provided that has a first surface 20a and a second surface 20b opposite the first surface 20a. The metal layer 20 may be formed by forming a metal film including dummy particles and then removing the dummy particles. In another implementation, the metal layer 20 may be formed by forming a metallic fiber in the form of a textile or non-woven fabric. The metal layer 20 may be formed by various methods different from those discussed above. The metal layer 20 may have a plurality of pores PO therein. The metal layer 20 may be formed to have a porosity of about 30% to about 100%.

Referring to FIG. 9, a first adhesive layer 10 may be provided on the first surface 20a of the metal layer 20. The first adhesive layer 10 may be provided in the form of a film shape. The first adhesive layer 10 may include an, e.g., electrically, non-conductive material, e.g., may be formed of a non-conductive material such as a non-conductive polymer, and/or may be formed to include a non-conductive material such as the first thermal conductive members 12. The first adhesive layer 10 may include an adhesive polymer.

A portion of the first adhesive layer 10 may be impregnated into the pores PO of the metal layer 20. For example, the first adhesive layer 10 may be pressed against the metal layer 20. The first adhesive layer 10 may be pressure-deformed to flow into the pores PO of the metal layer 20. In another implementation, the first adhesive layer 10 may be heated or melted to flow into the pores PO of the metal layer 20. A portion of the first adhesive layer 10 may flow into the pores PO of the metal layer 20 to form an adhesive substance 40, and other portion of the first adhesive layer 10 may remain on the metal layer 20.

In another example embodiment, an adhesive solution may be impregnated into the pores PO of the metal layer 20 to form an adhesive substance 40, and then the first surface 20a of the metal layer 20 may be attached with a first adhesive layer 10 that is formed in an individual process.

Afterwards, first and second passivation layers (see 32 and 34 of FIG. 1) may be attached to cover the metal layer 20 and the first adhesive layer 10, which may fabricate an adhesive film AF of FIG. 1.

Referring to FIG. 10, after filling the pores PO with the first adhesive layer 10, a process of FIG. 10 may be successively performed. For example, the first adhesive layer 10 may be continuously pressurized or melted to flow into the pores PO of the metal layer 20. Therefore, the first adhesive layer 10 on the first surface 20a of the metal layer 20 may fill all of the pores PO, and may flow out through the pores PO onto the second surface 20b of the metal layer 20, e.g., in the case of an open cell structure. A first portion of the first adhesive layer 10 may flow out onto the second surface 20b of the metal layer 20 to form a second adhesive layer 50, a second portion of the first adhesive layer 10 may flow into the pores PO of the metal layer 20 to form an adhesive substance 40, and a third portion of the first adhesive layer 10 may remain on the metal layer 20.

Afterwards, first and second passivation layers (see 32 and 34 of FIG. 1) may be attached to cover the first and second adhesive layers 10 and 50, which may fabricate an adhesive film AF of FIG. 3.

An adhesive film according to an example embodiment may be used for various semiconductor apparatuses.

Figure 11:
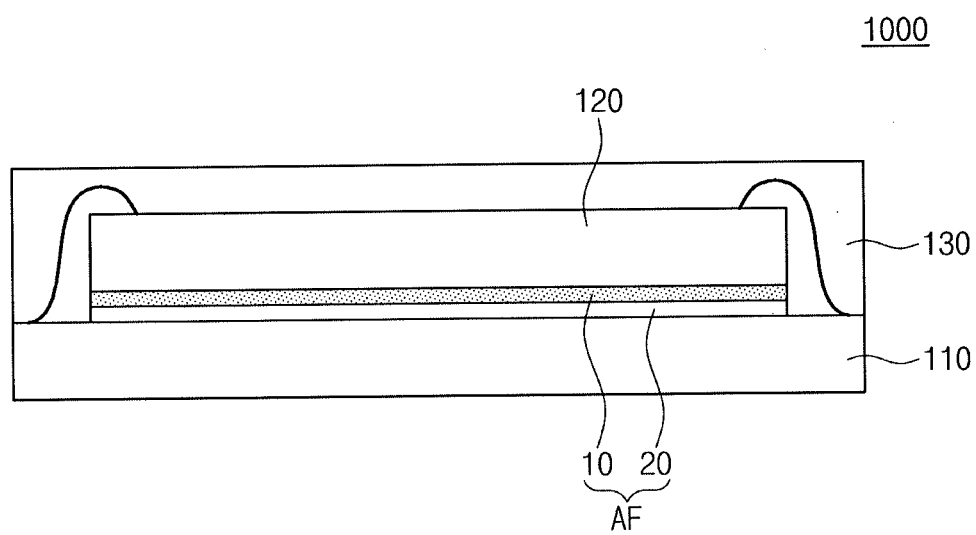
FIG. 11 illustrates a cross-sectional view showing a semiconductor apparatus according to an example embodiment.

FIG. 11 illustrates a cross-sectional view showing a semiconductor apparatus according to an example embodiment.

Referring to FIG. 11, a semiconductor apparatus 1000 may have a configuration in which an adhesive film is used to attach an electronic device to a substrate. The semiconductor apparatus 1000 may be provided in the form of a semiconductor package similar to those discussed below.

A substrate 110 may be provided. The substrate 110 may be a semiconductor substrate, an integrated circuit board (PCB), or another suitable substrate.

The substrate 110 may be provided thereon with an exothermic device 120 encapsulated with a mold layer 130. In this description, the exothermic device 120 may be any device from which heat is produced depending on an, e.g., electrical, operation thereof. If excessive heating occurs, e.g., due to heat generated during operation of the exothermic device 120, the exothermic device 120 may be fractured, and thus it may be desirable to radiate the heat. The exothermic device 120 may be wire-bonded to the substrate 110 or connected through other electrical connections to an external device.

Referring together to FIGS. 1 to 5 and 11, an adhesive film AF may be provided between the substrate 110 and the exothermic device 120. The adhesive film AF may be one selected from the adhesive films that are discussed with reference to FIGS. 1 to 5, from which the passivation layers (see 32 and 34 of FIG. 1 or 4) are removed. The adhesive film AF may attach the exothermic device 120 to a top surface of the substrate 110. For example, the metal layer 20 may be attached to the top surface of the substrate 110, and the first adhesive layer 10 may be attached to the exothermic device 120. In another implementation, or vice versa to that above, the first adhesive layer 10 may be attached to the top surface of the substrate 110, and the metal layer 20 may be attached to the exothermic device 120. In this case, to electrically insulate the exothermic device 120 from the adhesive film AF or the substrate 110, the metal layer 20 may be attached to an inactive surface of the exothermic device 120. As discussed with reference to FIGS. 1 and 2, the adhesive film AF according to an example embodiment may have an adhesive force on one side of the metal layer 20, and accordingly the exothermic device 120 may be attached to the substrate 110. When rigid adhesiveness is desired, the adhesive film AF may use the same adhesive film discussed with reference to FIGS. 4 and 5. For example, the adhesive film AF may further include the second adhesive layer (see 50 of FIG. 4) disposed on the metal layer 20. In this case, the first adhesive layer 10 may be attached to the top surface of the substrate 110, and the second adhesive layer 50 may be attached to the one side, or the inactive surface, of the exothermic device 120. As a result, the exothermic device 120 may be rigidly attached to the substrate 110. In addition, the adhesive film AF may have the first thermal conductive members (see 12 of FIGS. 1 to 5) distributed in the first adhesive layer 10. Hence, the adhesive film AF may have high thermal conductivity in the metal layer 20 and the first adhesive layer 10 as well. The adhesive film AF with high thermal conductivity may rapidly transfer heat generated from the exothermic device 120 and may contribute to thermal stability of the exothermic device 120.

Figure 12:
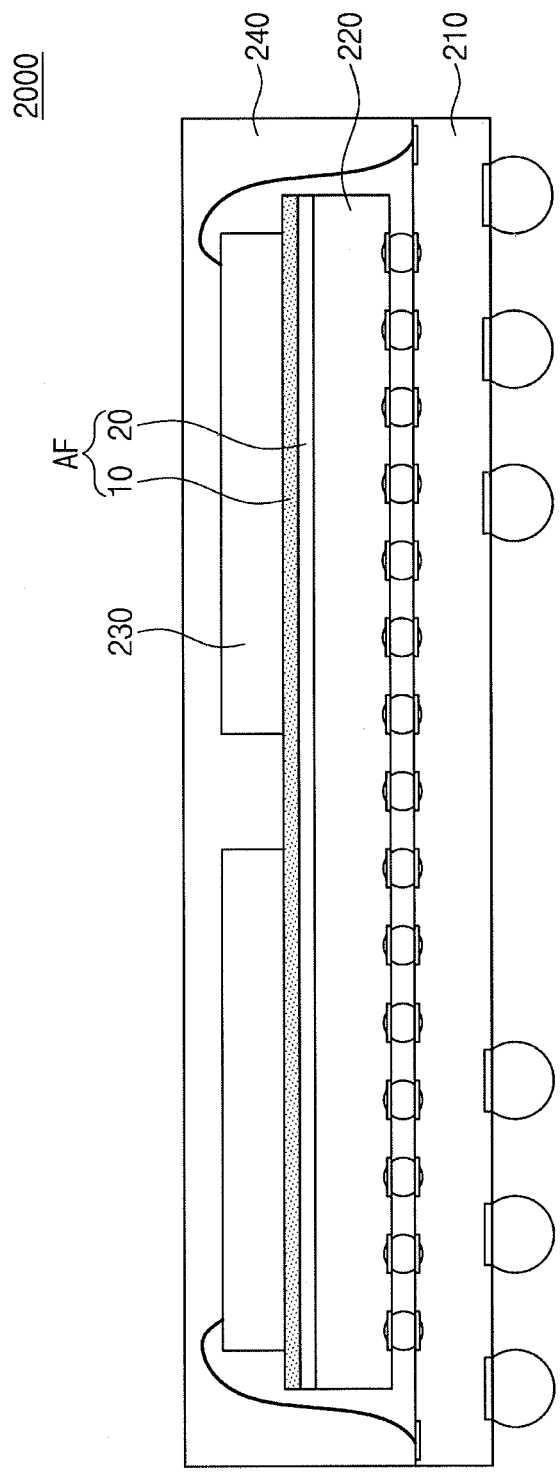
FIGS. 12 to 14 illustrate cross-sectional views showing a semiconductor package according to an example embodiment.

Differently from that discussed with reference to FIG. 11, semiconductor apparatuses may have a configuration in which one or more adhesive films are used to attach electronic devices to each other. FIG. 12 illustrates a cross-sectional view showing a semiconductor package according to an example embodiment.

Referring to FIG. 12, a semiconductor package 2000 may include a package substrate 210. The package substrate 210 may be a semiconductor substrate, an integrated circuit board (PCB), or another suitable substrate.

A first semiconductor chip 220 may be mounted on the package substrate 210. For example, the first semiconductor chip 220 may be flip-chip mounted on a top surface of the package substrate 210. The first semiconductor chip 220 may have a top surface as an inactive surface and a bottom surface, which faces the package substrate 210, as an active surface. The first semiconductor chip 220 may be an exothermic device.

At least one second semiconductor chip 230 may be mounted on the first semiconductor chip 220. The second semiconductor chip 230 may be mounted on the package substrate 210. For example, the second semiconductor chip 230 may be wire-bonded to the top surface of the package substrate 210. The second semiconductor chip 230 may have a top surface as an active surface and a bottom surface, which faces the first semiconductor chip 220, as an inactive surface. The package substrate 210 may be provided with a mold layer 240 thereon that encapsulates the first and second semiconductor chips 220 and 230.

Referring together to FIGS. 1 to 5 and 12, an adhesive film AF may be provided between the first semiconductor chip 220 and the second semiconductor chip 230. The adhesive film AF may be one selected from the adhesive films that are discussed with reference to FIGS. 1 to 5, from which the passivation layers (see 32 and 34 of FIG. 1 or 4) are removed. The adhesive film AF may attach the second semiconductor chip 230 to the top surface of the first semiconductor chip 220. For example, the metal layer 20 may be attached to the first semiconductor chip 220, and the first adhesive layer 10 may be attached to the second semiconductor chip 230. The adhesive film AF according to the present example embodiment may have an adhesive force on one side of the metal layer 20, and accordingly the second semiconductor chip 230 may be attached to the first semiconductor chip 220. When rigid adhesiveness is desired, the adhesive film AF may further include the second adhesive layer (see 50 of FIG. 4) disposed on the metal layer 20. In this case, the first adhesive layer 10 may be attached to the top surface of the first semiconductor chip 220, and the second adhesive layer 50 may be attached to the bottom surface of the second semiconductor chip 230. Therefore, the first and second semiconductor chips 220 and 230 may be rigidly attached to each other.

The adhesive film AF may have the first thermal conductive members (see 12 of FIGS. 1 to 5) distributed in the first adhesive layer 10. Hence, the adhesive film AF may have high thermal conductivity in the metal layer 20 and the first adhesive layer 10 as well. Heat generated from the first semiconductor chip 220 may be rapidly outwardly discharged through the second semiconductor chip 230 and the adhesive film AF with high thermal conductivity, which may result in contribution to thermal stability of the semiconductor package 2000.

In another implementation, the second semiconductor chip 230 may be an exothermic device. In this case, heat generated from the second semiconductor chip 230 may be discharged upwardly and/or transferred toward the package substrate 210 through the adhesive film AF and the first semiconductor chip 220. For example, heat generated from the second semiconductor chip 230 may be distributed along various pathways, which may result in contribution to thermal stability of the semiconductor package 2000.

Figure 13:
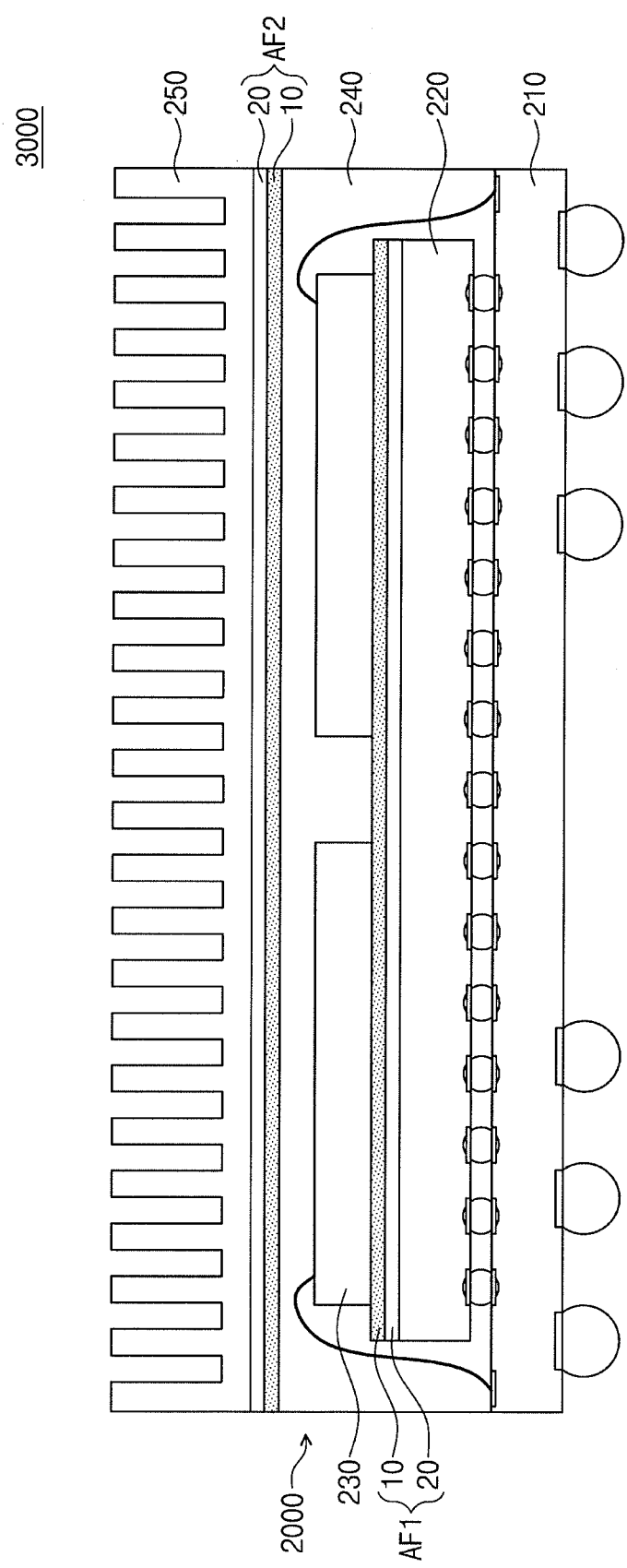

Differently from that discussed with reference to FIG. 12, semiconductor packages may have a configuration in which an adhesive film is used to attach a heat radiator, e.g., a heat sink, to an exothermic device. FIG. 13 illustrates a cross-sectional view showing a semiconductor package according to an example embodiment.

Referring to FIG. 13, a semiconductor package 3000 may include a heat sink 250 provided on the semiconductor package 2000 of FIG. 12. A second adhesive film AF2 may be used to attach the heat sink 250 to the semiconductor package 2000 (see 2000 of FIGS. 12), and a first adhesive film AF1 may be used to attach the first and second semiconductor chips 220 and 230 to each other. Each of the first and second adhesive films AF1 and AF2 may be one selected from the adhesive films that are discussed with reference to FIGS. 1 to 5, from which the passivation layers (see 32 and 34 of FIG. 1 or 4) are removed. The second adhesive film AF2 may attach the heat sink 250 to the semiconductor package 2000. For example, the first adhesive layer 10 of the second adhesive film AF2 may be attached to a top surface of the mold layer 240, and the metal layer 20 of the second adhesive film AF2 may be attached to a bottom surface of the heat sink 250. The second adhesive film AF2 according to the present example embodiment may have an adhesive force on one side of the metal layer 20, and accordingly the heat sink 250 may be attached to the semiconductor package 2000.

The second adhesive film AF2 may have the first thermal conductive members (see 12 of FIGS. 1 to 5) distributed in the first adhesive layer 10. Hence, the second adhesive film AF2 may have high thermal conductivity in the metal layer 20 and the first adhesive layer 10 as well. Heat generated from the semiconductor package 2000 may be promptly transferred toward the heat sink 250 through the second adhesive film AF with high thermal conductivity, and thus the semiconductor package 3000 may increase in heat radiation.

Figure 14:
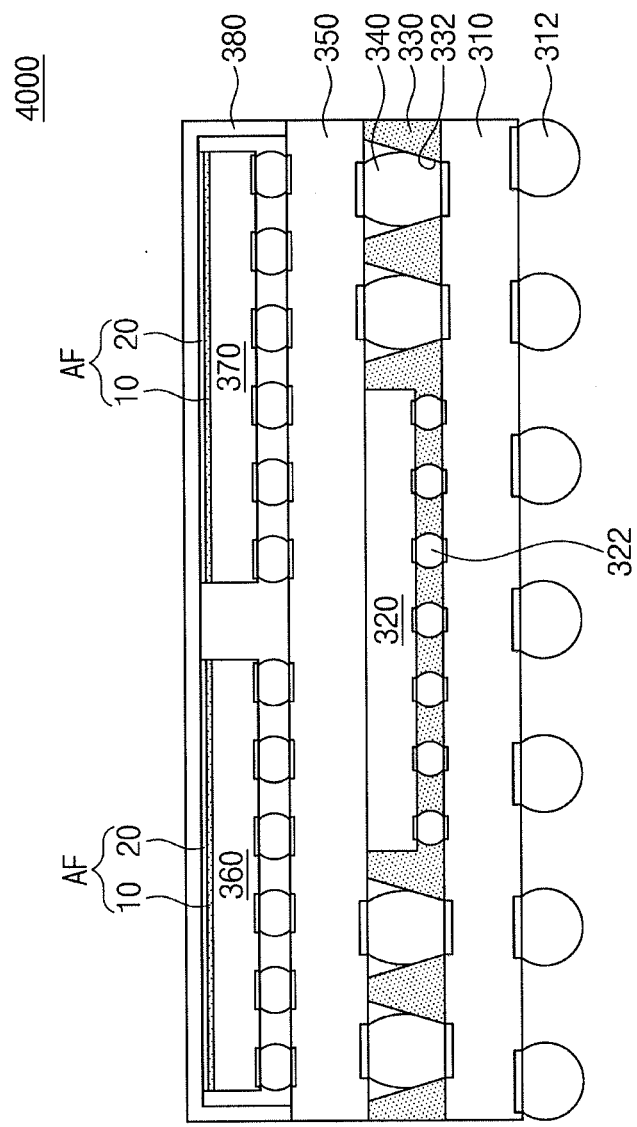

FIG. 14 illustrates a cross-sectional view showing a semiconductor package according to an example embodiment.

Referring to FIG. 14, a semiconductor package 4000 may include a lower package and an upper package. The lower package may include a lower package substrate 310, a lower semiconductor chip 320, and a lower mold layer 330.

The lower package substrate 310 may be provided. The lower package substrate 310 may be a printed circuit board (PCB) having signal patterns on a top surface thereof. In another implementation, the lower package substrate 310 may have a structure in which at least one dielectric layer and at least one connection line layer are alternately stacked.

External terminals 312 may be disposed below the lower package substrate 310. The external terminals 312 may include solder balls or solder pads, and the semiconductor package 4000 may include one of a ball grid array (BGA) type, a fine ball grid array (FBGA) type, or a land grid array (LGA), based on type of the external terminals 312.

The lower semiconductor chip 320 may be mounted on a top surface of the lower package substrate 310. For example, the lower semiconductor chip 320 may be flip-chip mounted on the lower package substrate 310. For example, the lower semiconductor chip 320 may be electrically connected to the lower package substrate 310 through lower chip terminals 322 such as solder balls or solder bumps. Various methods may be utilized to electrically connect the lower semiconductor chip 320 to the lower package substrate 310. The lower semiconductor chip 320 may be, e.g., a logic chip or a memory chip. The logic chip may include a logic part and a memory part. For example, the memory chip may be DRAM, NAND flash, NOR flash, PRAM, ReRAM, or MRAM.

The lower package substrate 310 may be provided thereon with the lower mold layer 330 encapsulating the lower semiconductor chip 320. For example, the lower mold layer 330 may be provided to expose a top surface of the lower semiconductor chip 320, or differently from that shown, to cover the top surface of the lower semiconductor chip 320. In addition, the lower mold layer 330 may have connection holes 332 penetrating therethrough. The connection holes 332 may be spaced apart from the lower semiconductor chip 320. The lower mold layer 330 may include a dielectric polymeric material such as an epoxy molding compound (EMC).

The connection holes 332 may be provided therein with connection terminals 340 in contact with the lower package substrate 310. The connection terminals 340 may be coupled to the lower package substrate 310. The connection terminals 340 may lie on the top surface of the lower package substrate 310 and have electrical connection with the lower package substrate 310 and the lower semiconductor chip 320.

The upper package may be provided on the lower package. The upper package may include an upper package substrate 350 and upper semiconductor chips 360 and 370.

The upper package substrate 350 may be provided on the lower package. For example, the upper package substrate 350 may be disposed on the lower semiconductor chip 320 and the lower mold layer 330. The connection terminals 340 may be coupled to a bottom surface of the upper package substrate 350. The connection terminals 340 may lie on the bottom surface of the upper package substrate 350 and have electrical connection with the upper package substrate 350.

A first upper semiconductor chip 360 and a second upper semiconductor chip 370 may be disposed on the upper package substrate 350. The first and second upper semiconductor chips 360 and 370 may be spaced apart from each other. Each of the first and second upper semiconductor chips 360 and 370 may be mounted on the upper package substrate 350. A flip-chip bonding or wire bonding method may be used to mount the first and second upper semiconductor chips 360 and 370 on a top surface of the upper package substrate 350. The first and second upper semiconductor chips 360 and 370 may be heat devices. The first and second upper semiconductor chips 360 and 370 may be logic chips or memory chips.

A heat radiator 380 may be provided on the first and second upper semiconductor chips 360 and 370. The heat radiator 380 may be provided on the upper package substrate 350, while surrounding the first and second upper semiconductor chips 360 and 370. The heat radiator 380 may be formed to cover the first and second upper semiconductor chips 360 and 370. The heat radiator 380 may be in contact with top surfaces of the first and second upper semiconductor chips 360 and 370. The heat radiator 380 may outwardly discharge heat generated from the first and second upper semiconductor chips 360 and 370. The heat radiator 380 may include, e.g., a heat spreader or a heat sink.

Referring together to FIGS. 1 to 5 and 14, an adhesive film AF may be provided between the heat radiator 380 and each of the first and second upper semiconductor chips 360 and 370. The adhesive film AF may be one selected from the adhesive films that are discussed with reference to FIGS. 1 to 5, from which the passivation layers (see 32 and 34 of FIG. 1 or 4) are removed. The adhesive film AF may attach the heat radiator 380 to the top surface of each of the first and second upper semiconductor chips 360 and 370. For example, the first adhesive layer 10 may be attached to the top surface of each of the first and second upper semiconductor chips 360 and 370, and the metal layer 20 may be attached to the heat radiator 380. When rigid adhesiveness is desired, the adhesive film AF may further include the second adhesive layer (see 50 of FIG. 4) disposed on the metal layer 20. In this case, the first adhesive layer 10 may be attached to the top surface of each of the first and second upper semiconductor chips 360 and 370, and the second adhesive layer 50 may be attached to the heat radiator 380. Thus, the first and second upper semiconductor chips 360 and 370 may be rigidly attached to the heat radiator 380.

The adhesive film AF may have the first thermal conductive members (see 12 of FIGS. 1 to 5) distributed in the first adhesive layer 10. Hence, the adhesive film AF may have high thermal conductivity in the metal layer 20 and the first adhesive layer 10 as well. Heat generated from the first and second upper semiconductor chips 360 and 370 may be outwardly discharged at high speeds through the heat radiator 380 and the adhesive film AF with high thermal conductivity, which may result in contribution to thermal stability of the semiconductor package 4000.

The upper package substrate 350 may be provided thereon with an upper mold layer (not shown) encapsulating the first and second upper semiconductor chips 360 and 370. The upper mold layer (not shown) may include a dielectric polymeric material such as an epoxy molding compound (EMC).

As described above, example embodiments may provide an adhesive film with improved workability. For example, an adhesive film according to an example embodiment may be provided with a metal layer in the form of a porous shape, which porous metal layer may increase workability of the adhesive film.

In addition, an adhesive substance filling pores of the metal layer may rigidly attach the metal layer to a first adhesive layer. Therefore, the metal layer may not be delaminated from the first adhesive layer, and the adhesive film may increase in structural stability.

Example embodiments may provide an adhesive film with increased thermal conductivity. For example, the adhesive film may include thermal conductive members in the first adhesive layer or the adhesive layer, and accordingly may increase in thermal conductivity.

Example embodiments may provide a semiconductor apparatus and a semiconductor package with enhanced thermal characteristics. For example, a semiconductor apparatus and a semiconductor package using the adhesive film may effectively discharge heat generated therefrom, and the adhesive film may contribute to thermal stability of the semiconductor apparatus and the semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thermal conductive film, comprising:
   a porous metal layer consisting of a sponge comprised entirely of metal, the sponge including pores distributed as an open cell structure throughout an entire thickness of the sponge;
   an adhesive substance filling the pores of the porous metal layer;
   a first adhesive layer on and contacting one side of the porous metal layer; and
   a plurality of first thermal conductive members distributed in the first adhesive layer.

2. The thermal conductive film as claimed in claim 1, wherein a porosity of the porous metal layer is about 30% to less than 100%.

3. The thermal conductive film as claimed in claim 1, wherein:
   at least one of the pores is open at a surface of the porous metal layer, and
   the adhesive substance filling the at least one of the pores is exposed at the surface of the porous metal layer.

4. The thermal conductive film as claimed in claim 1, wherein:
   the adhesive substance and the first adhesive layer are in contact with each other at an interface between the porous metal layer and the first adhesive layer, and the adhesive substance and the first adhesive layer are provided in the form of a single body including the same material.

5. The thermal conductive film as claimed in claim 1, wherein a major axis of the pores has a length of about 5 µm to about 3000 µm.

6. The thermal conductive film as claimed in claim 1, wherein the plurality of first thermal conductive members have one or more of a bead shape, a wire shape, or a rod shape.

7. The thermal conductive film as claimed in claim 1, wherein the plurality of first thermal conductive members occupy a volume fraction of about 1% to about 50% of a total volume of the first adhesive layer.

8. The thermal conductive film as claimed in claim 1, wherein the plurality of first thermal conductive members are distributed in the adhesive substance.

9. The thermal conductive film as claimed in claim 1, further comprising a second adhesive layer on another side of the porous metal layer, the other side being opposite to the first adhesive layer.

10. The thermal conductive film as claimed in claim 9, further comprising a plurality of second thermal conductive members distributed in the second adhesive layer, wherein:
the first adhesive layer includes a different material from that of the adhesive substance, and
the second adhesive layer includes a different material from that of the adhesive substance.

11. The thermal conductive film as claimed in claim 9, further comprising:
a first removable polyethylene terephthalate (PET) or paper layer covering the second adhesive layer; and
a second removable polyethylene terephthalate (PET) or paper layer covering the first adhesive layer.

12. A thermal conductive film, comprising:
a porous metal layer consisting of a sponge made entirely of metal, the sponge including pores distributed as an open cell structure throughout an entire thickness of the sponge;
an adhesive substance filling the pores of the porous metal layer;
a first adhesive layer on and contacting one side of the porous metal layer; and
a plurality of thermal conductive members distributed in the adhesive substance.

13. The thermal conductive film as claimed in claim 12, further comprising a second adhesive layer on another side of the porous metal layer, the other side being opposite to the first adhesive layer.

14. The thermal conductive film as claimed in claim 13, wherein:
the plurality of thermal conductive members are distributed in the first adhesive layer,
the first adhesive layer includes a different material from that of the adhesive substance, and
the second adhesive layer includes a different material from that of the adhesive substance.

15. The thermal conductive film as claimed in claim 12, wherein:
at least one of the pores is open at a surface of the porous metal layer, and
the adhesive substance filling the at least one of the pores is exposed at the surface of the porous metal layer.

16. The thermal conductive film as claimed in claim 12, wherein:
the adhesive substance and the first adhesive layer are in contact with each other at an interface between the porous metal layer and the first adhesive layer, and
the adhesive substance and the first adhesive layer are provided in the form of a single body including the same material.

17. The thermal conductive film as claimed in claim 12, wherein a major axis of the pores has a length of about 5 µm to about 3000 µm.

18. The thermal conductive film as claimed in claim 12, wherein the plurality of thermal conductive members occupy a volume fraction of about 1% to about 50% of a total volume of the first adhesive layer.

19. A thermal conductive film, comprising:
a porous metal layer consisting of a sponge, the sponge including pores distributed as an open cell structure throughout an entire thickness of the sponge;
an adhesive substance filling the pores of the porous metal layer;
a first adhesive layer on one side of the porous metal layer; and
a plurality of first thermal conductive members distributed in the first adhesive layer,
wherein a major axis of the pores has a length in the range of 5 µm to 3000 µm.

20. The thermal conductive film as claimed in claim 19, wherein a porosity of the porous metal layer is about 30% to less than 100%.

* * * * *